US006780022B1

(12) United States Patent
Fan et al.

(10) Patent No.: US 6,780,022 B1
(45) Date of Patent: Aug. 24, 2004

(54) CONNECTOR

(75) Inventors: Kuang-Cheng Fan, Taipei (TW); Bar-Long Denq, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 10/604,767

(22) Filed: Aug. 14, 2003

(30) Foreign Application Priority Data

May 2, 2003 (TW) ..................................... 92208061 U

(51) Int. Cl.[7] .......................... H01R 12/00; H05K 1/00

(52) U.S. Cl. ....................................................... 439/66

(58) Field of Search .............................. 439/66, 91, 65

(56) References Cited

U.S. PATENT DOCUMENTS 4,408,814 A * 10/1983 Takashi et al. ............... 439/91
6,296,493 B1 * 10/2001 Michiya ...................... 439/66

* cited by examiner

*Primary Examiner*—Javaid H. Nasri
(74) *Attorney, Agent, or Firm*—Winston Hsu

(57) ABSTRACT

A connector for transmitting electrical signals from a first board to a second board includes at least one conductive media. The conductive media includes a plurality of insulating layers and a plurality of conductive layers. Each conductive layer is formed between two insulating layers. The connector further includes a frame including at least one hollow space for accommodating the conductive media.

18 Claims, 14 Drawing Sheets

CONNECTOR

BACKGROUND OF INVENTION

1. Field of the Invention

The present invention relates to a connector, and more specifically, to a connector for connecting a first board to a second board.

2. Description of the Prior Art

In order to connect devices and interfaces, various kinds of connectors are widely used in electronic products such as notebooks, motherboards and interface cards etc. Most of the connectors transmit electrical signals through mutual contact of metal lines. Please refer to FIG. 1. FIG. 1 is a 3-dimensional diagram of a metal line connector 10 according to the prior art. The metal line connector 10 includes a male connector 12 installed on an interface card 14 and a female connector 16 installed on a circuit board 18, wherein the male connector 12 and the female connector 16 are detachable by inserting the male connector 12 into the female connector 16. Please refer to FIG. 2. FIG. 2 is a side-view diagram of the metal line connector 10 while separated. The transmission of electrical signals between the interface card 14 and the circuit board 18 depends on mutual contact of metal lines 20 on the male connector 12 and metal lines 22 on the female connector 16. Please refer to FIG. 3. FIG. 3 is a side-view diagram of the metal line connector 10 while connected. The male connector 12 and the female connector 16 of the metal line connector 10 are connected by pressing both connectors 12, 16 to insert the male connector 12 into the female connector 16, so that the metal lines 20 and the metal lines 22 can contact each other completely to ensure the signal transmission. Please refer to FIG. 4. FIG. 4 is a top-view diagram of the female connector 16 connected to the circuit board 18. Electrical signals output by the interface card 14 are transmitted from the metal lines 20 of the male connector 12 to the metal lines 22 of the female connector 16, then transmitted to the circuit board 18 through goldfingers 24 on the circuit board 18 connected to the metal lines 22.

However, the metal line connector 10 according to the prior art depends on connection of rigid bodies, therefore due to the height of the connector itself, the two boards to be connected cannot be adhered to each other. To keep pace with the trend requiring electronic products to be compact, the required space of the connector must be reduced. Secondly, the interval distance between the metal lines is limited in manufacturing process. Considering the technology and the cost, the interval distance can be reduced to approximately 0.6 mm. The required space of the connector can be reduced through a further reduction of the interval distance of the metal lines. Thirdly, metal line connectors are widely used devices produced in enormous quantities. It is beneficial to the industry if other cost-saving materials are used.

SUMMARY OF INVENTION

It is therefore a primary objective of the present invention to provide a connector to solve the problems of the prior art mentioned above.

Briefly summarized, a connector according to the present invention is used to connect a first board to a second board, which includes at least one conductive media comprising a plurality of insulating layers and a plurality of conductive layers, in which each layer is formed between two insulating layers. The connector further includes a frame comprising a hollow space for holding the conductive media.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
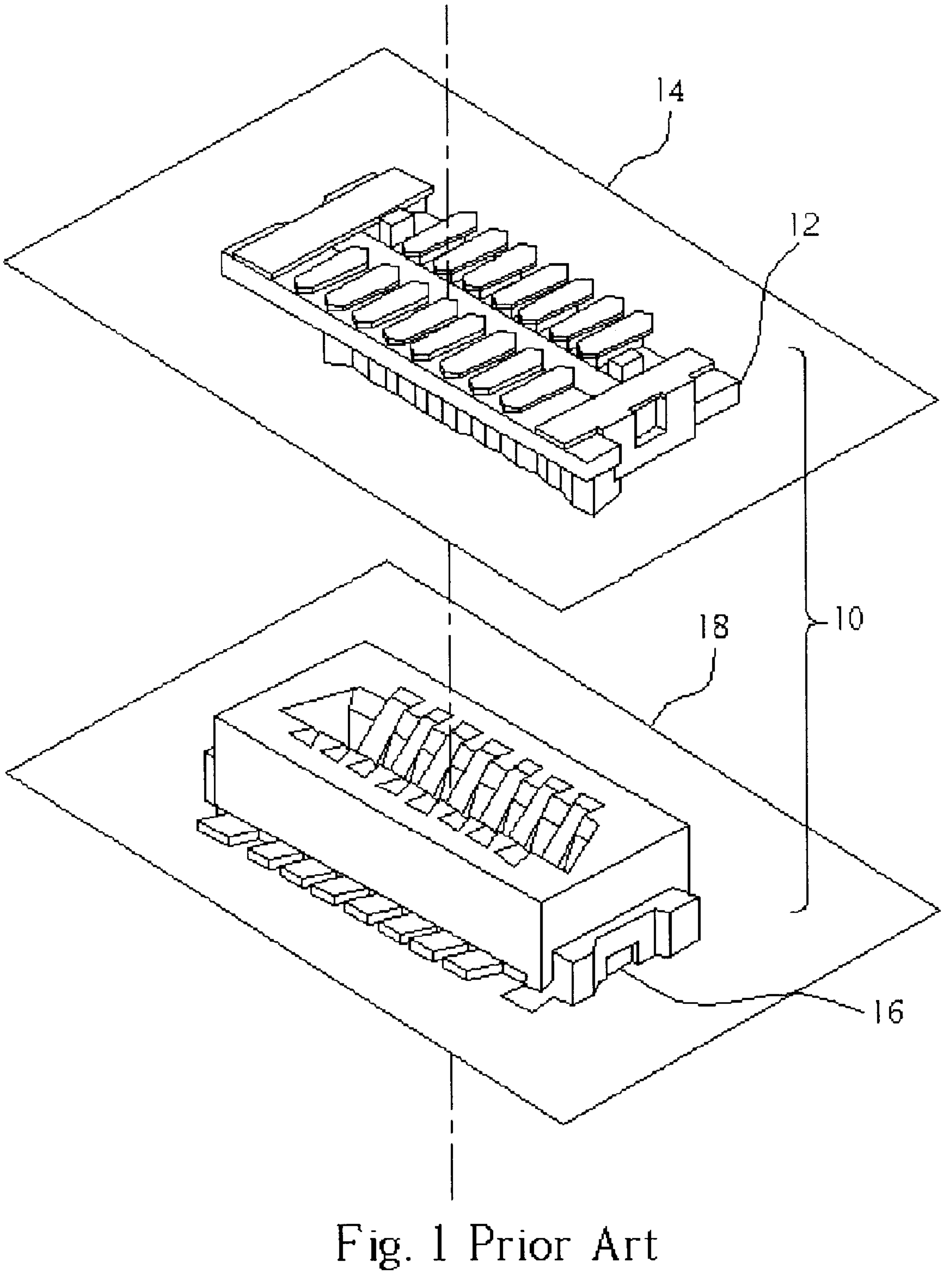
Fig. 1 Prior Art
FIG. 1 is a 3-dimensional diagram of a metal line connector according to the prior art.
Figure 2:
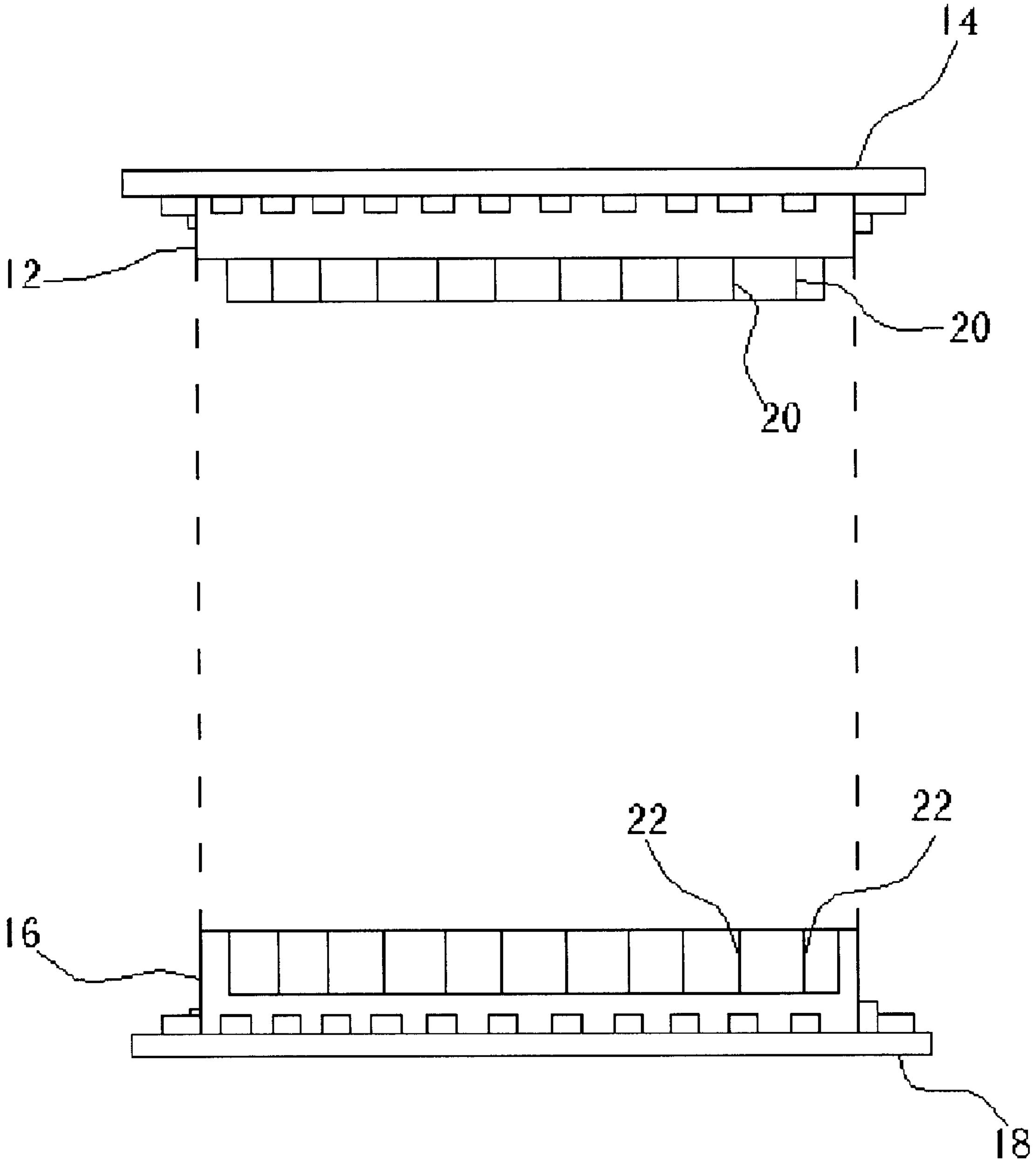
Fig. 2 Prior Art
FIG. 2 is a side-view diagram of the metal line connector of FIG. 1 while separated.
Figure 3:
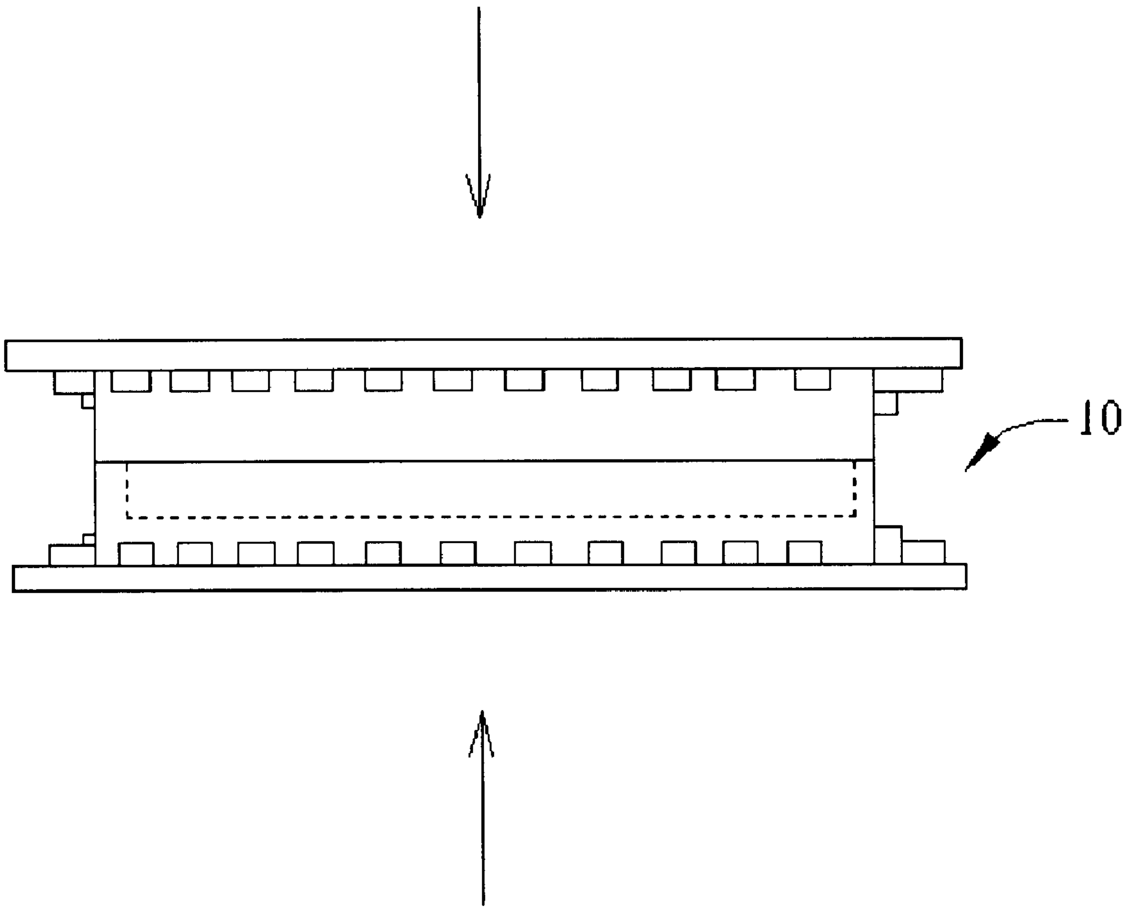
Fig. 3 Prior Art
FIG. 3 is a side-view diagram of the metal line connector of FIG. 1 while connected.
Figure 4:
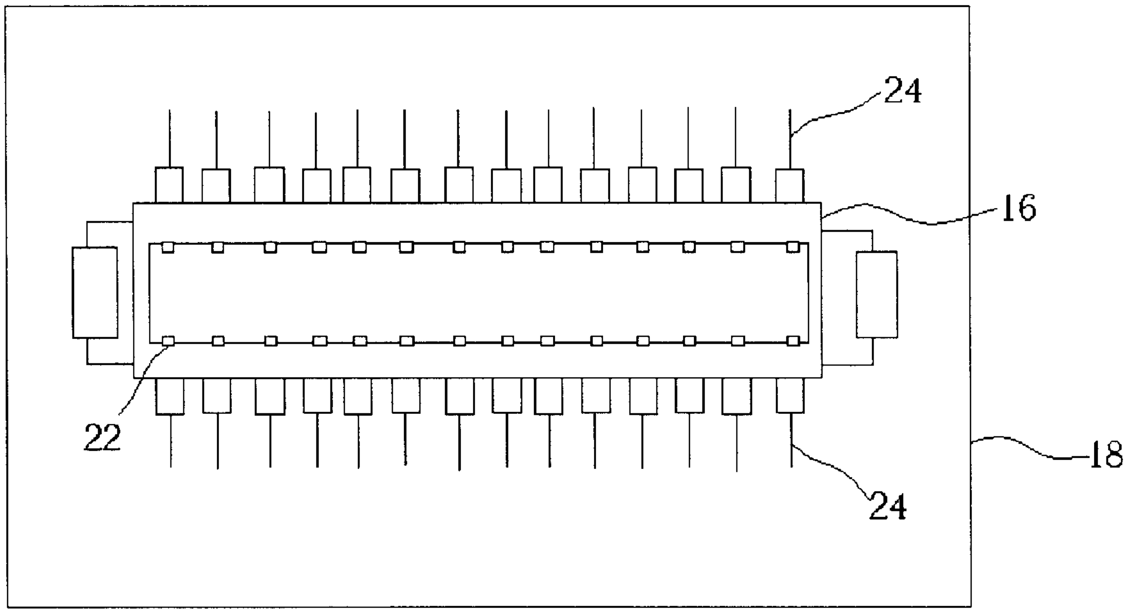
Fig. 4 Prior Art
FIG. 4 is a top-view diagram of the female connector of FIG. 1 connected to the circuit board.
Figure 5:
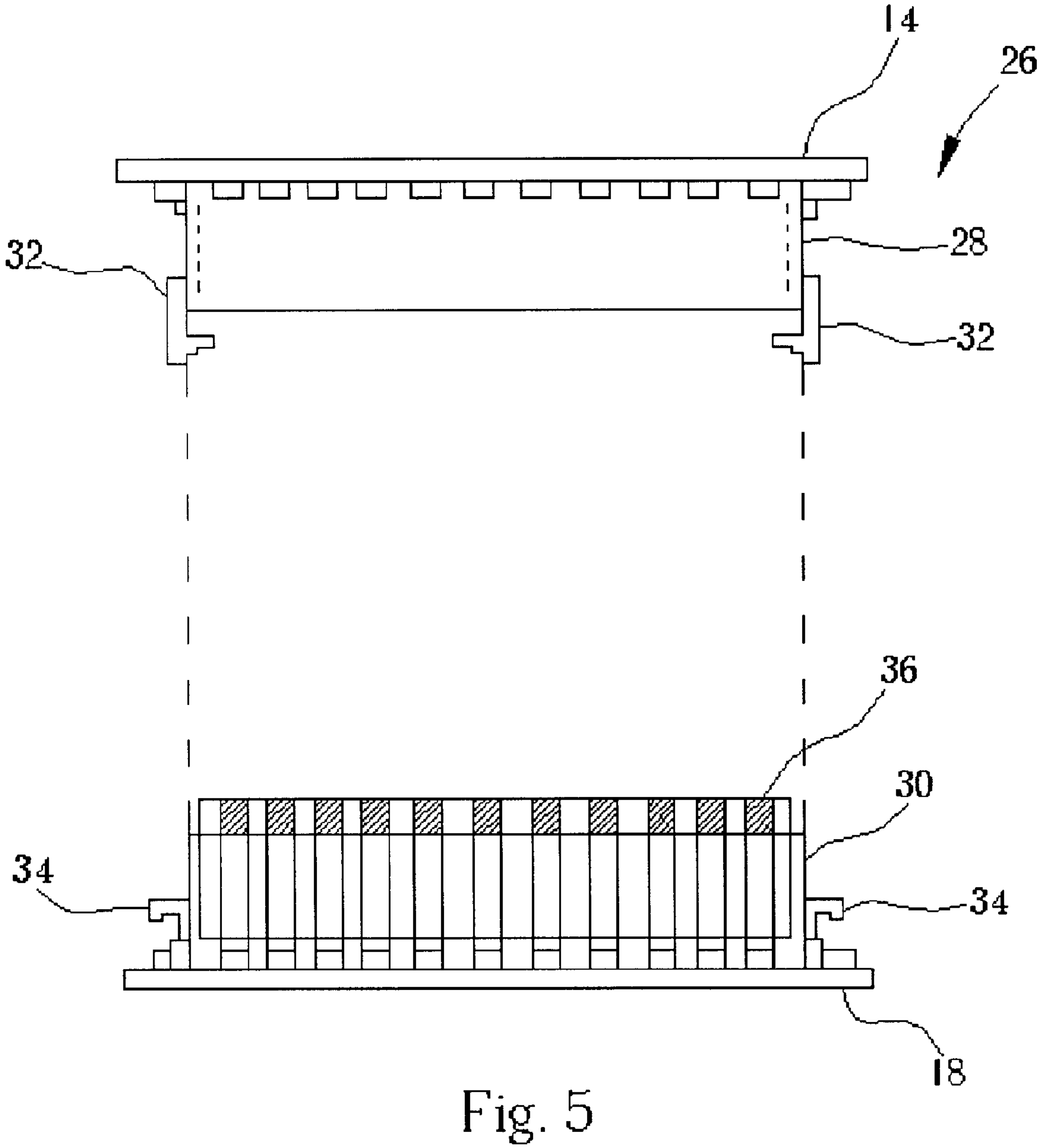
FIG. 5 is a side-view diagram of a first connector while separated according to the first embodiment of the present invention.
Figure 6:
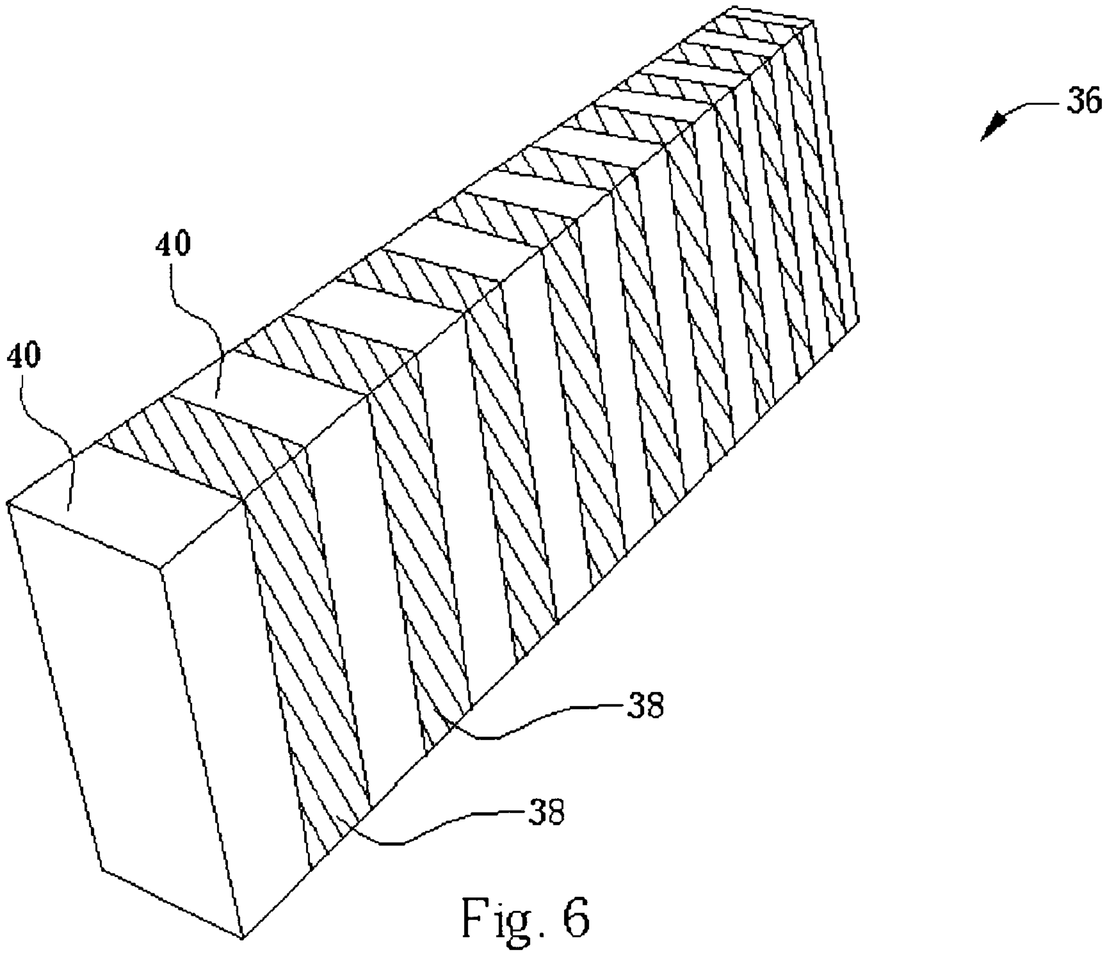
FIG. 6 is a diagram of the conductive medium shown in FIG. 5.

Please refer to FIG. 5. FIG. 5 is a side-view diagram of a first connector 26 while separated according to the first embodiment of the present invention. The first connector 26 includes a first upper frame 28 installed on an interface card 14 and a first lower frame 30 installed on a circuit board 18 which could be a printed circuit board (PCB). The first upper frame 28 includes two upper hooks 32, and the first lower frame 30 includes two lower hooks 34 so that the first upper frame 28 and the first lower frame 30 are detachable by hooking the upper hooks 32 and the lower hooks 34 together. The first upper frame 28 and the first lower frame 30 are plastic frames, and the first connector 26 further comprises two rectangular cubic shaped rows of conductive media 36 running parallel to each other. (Because FIG. 5 is a side-view, only one row of conductive media 36 is visible in FIG. 5.) Please refer to FIG. 6. FIG. 6 is a diagram of the conductive media 36. The conductive media 36 includes a plurality of conductive layers 38 which can be composed of conductive ceramic particles, metal particles or conductive metal lines, and a plurality of insulating layers 40 which can be composed of insulating rubber or insulating ceramic materials. The conductive layers 38 and the insulating layers

40 are arranged alternately so that the conductive layers 38 do not contact with each other in order to be insulated.

Figure 7:
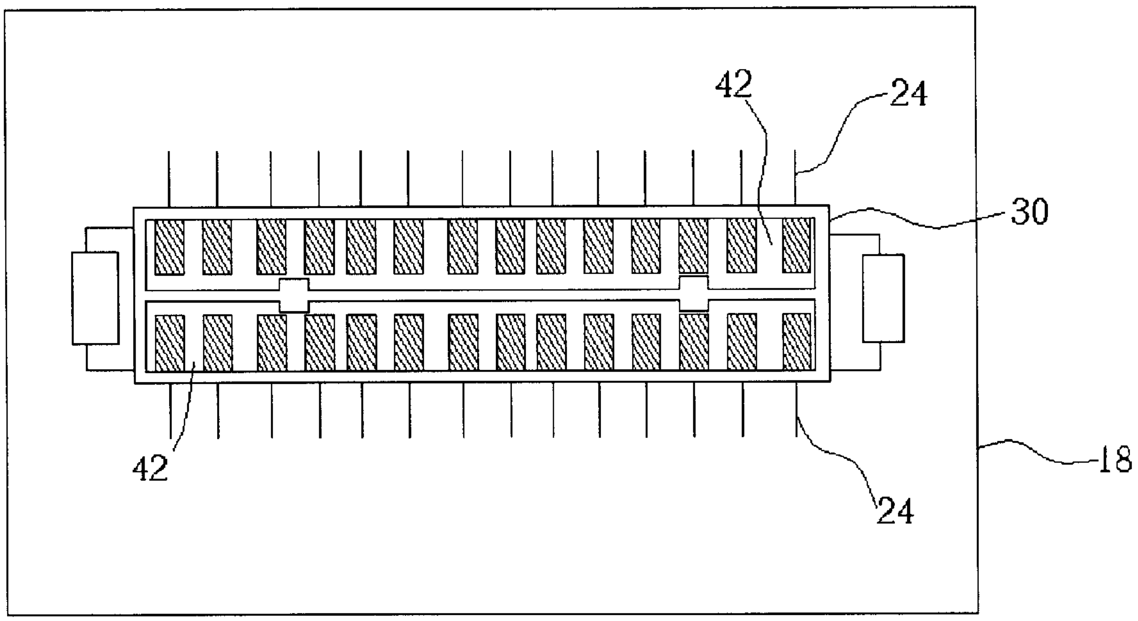
FIG. 7 is a top-view diagram of the first lower frame shown in FIG. 5 connected to the circuit board.
Figure 8:
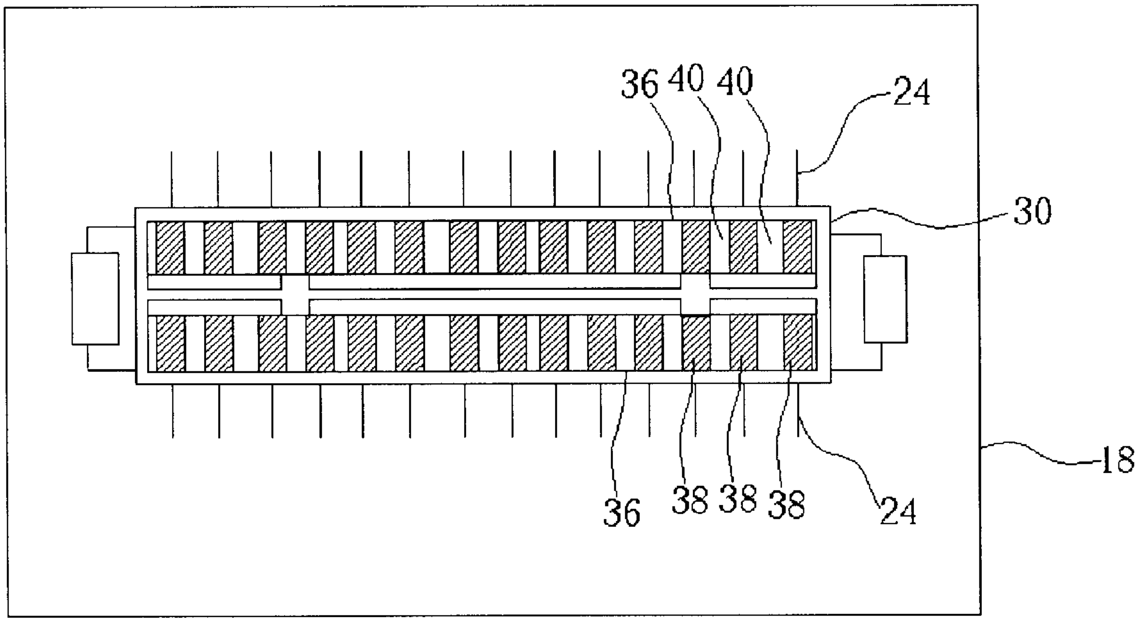
FIG. 8 is a top-view diagram of the conductive media shown in FIG. 5 held in place by the hollow spaces.

Please refer to FIG. 7. FIG. 7 is a top-view diagram of the first lower frame 30 connected to the circuit board 18. The first lower frame 30 includes two hollow spaces 42 for holding the two rows of conductive media 36. The lower sides of the conductive layers 38 on the conductive media 36 are electrically connected directly to the goldfingers 24 on the circuit board 18. Please refer to FIG. 8. FIG. 8 is a top-view diagram of the conductive media 36 held in place by the hollow spaces 42. Each one of the conductive layers 38 is connected to a metal line of the goldfingers 24 in order to transmit electrical signals between the conductive layers 38 and the circuit board 18. The structure of the first upper frame 28 is the same to that of the first lower frame 30, which includes two hollow spaces 42. The connection of the first upper frame 28 and the interface card 14 is the same to that shown in FIG. 7. The upper sides of the conductive layers 38 on the conductive media 36 are electrically connected directly to the goldfingers 24 on the interface card 14, each one of the conductive layers 38 is connected to a metal line of the goldfingers 24 in order to transmit electrical signals between the conductive layers 38 and the interface card 14. A similar descriptive diagram is hereby omitted.

Figure 9:
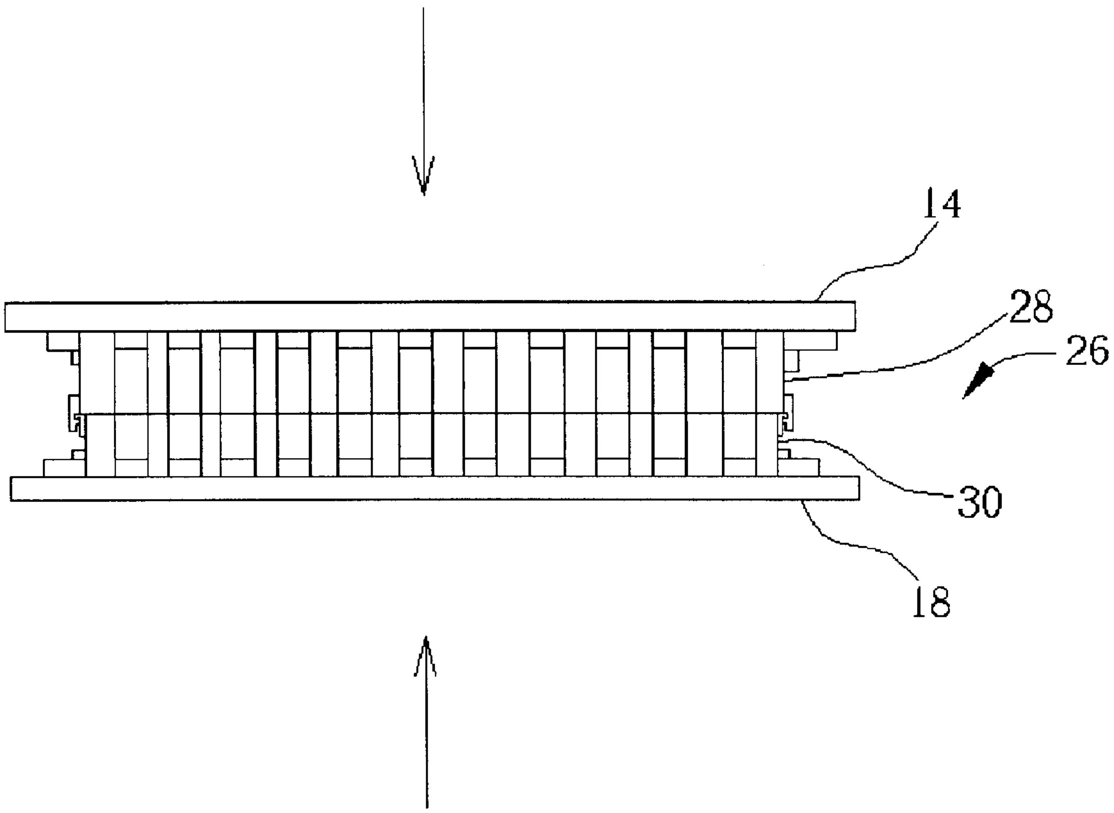
FIG. 9 is a side-view diagram of the first connector shown in FIG. 5 while connected.

The conductive media 36 are fixed to the hollow spaces of the first upper frame 28 and the first lower frame 30. Please refer to FIG. 9. FIG. 9 is a side-view diagram of the first connector 26 in connection. The first upper frame 28 and the first lower frame 30 are connected to each other by pressing both frames 28,30 to hook the upper hooks 32 and the lower hooks 34, so that the upper sides of the conductive layers 38 are electrically connected to the goldfingers on the interface card 14, and the lower sides of the conductive layers 38 are electrically connected to the goldfingers on the circuit board 18. In this way the electrical signals between the interface card 14 and the circuit board 18 can be transmitted through the conductive layers 38.

Figure 10:
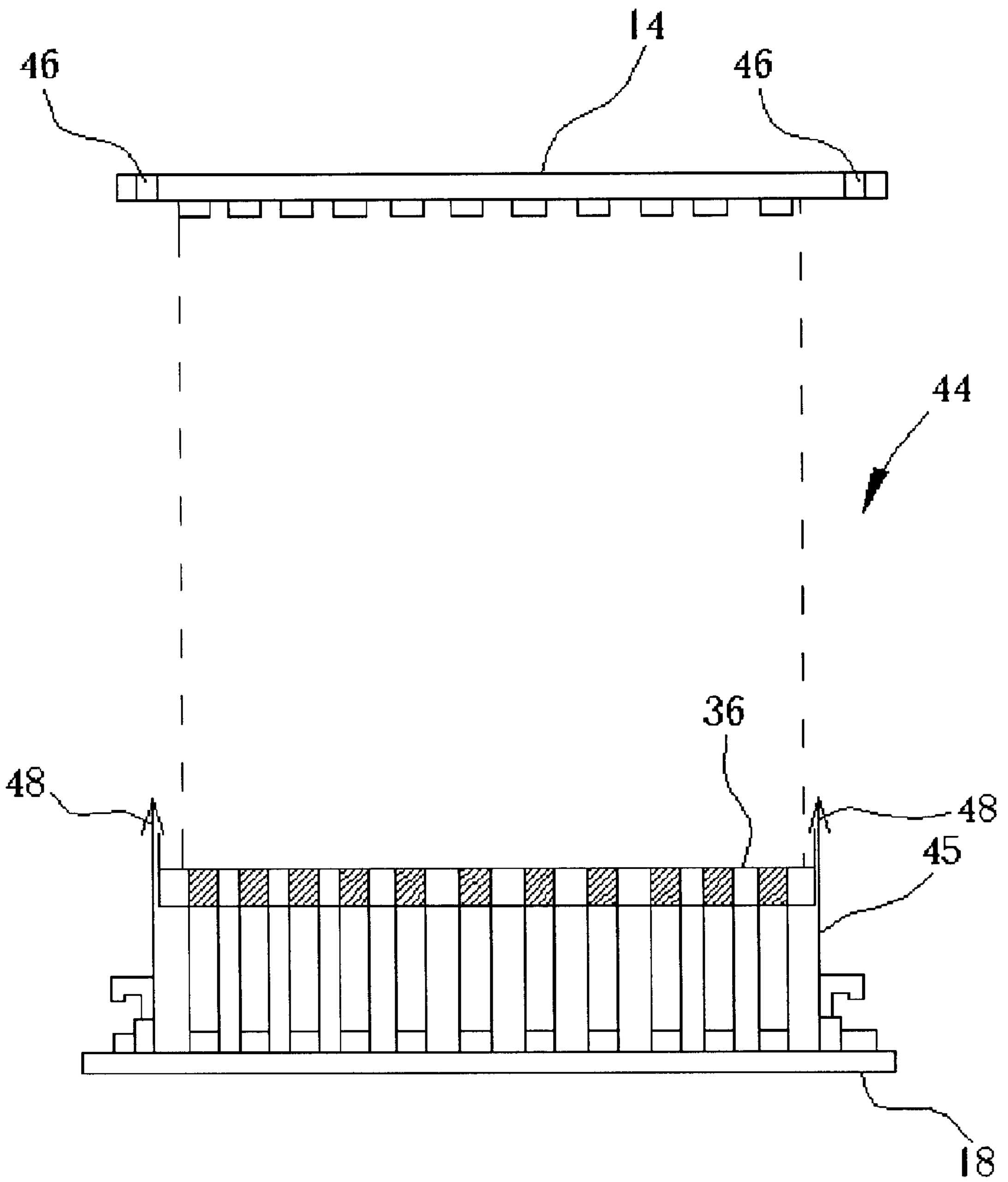
FIG. 10 is a side-view diagram of a second connector while separated according to the second embodiment of the present invention.

Please refer to FIG. 10. FIG. 10 is a side-view diagram of a second connector 44 while separated according to the second embodiment of the present invention. The second connector 44 includes a frame 45 installed on a circuit board 18. The circuit board 18 can be a PCB. The frame 45 includes two top plugs 48, and an interface card 14 includes two apertures 46 so that the interface card 14 is fixed to the frame 45 by inserting the top plugs 48 on the frame 45 to the apertures 46. The frame 45 is a plastic frame, and the second connector 44 further comprises two rectangular cubic shaped rows of conductive media 36 running parallel to each other. The conductive media 26 according to the second embodiment are of the same structure as the conductive media 26 in FIG. 6, and the electrical connection between the interface card 14 and the circuit board 18 is the same as that in the first embodiment, therefore further descriptions are hereby omitted.

Figure 11:
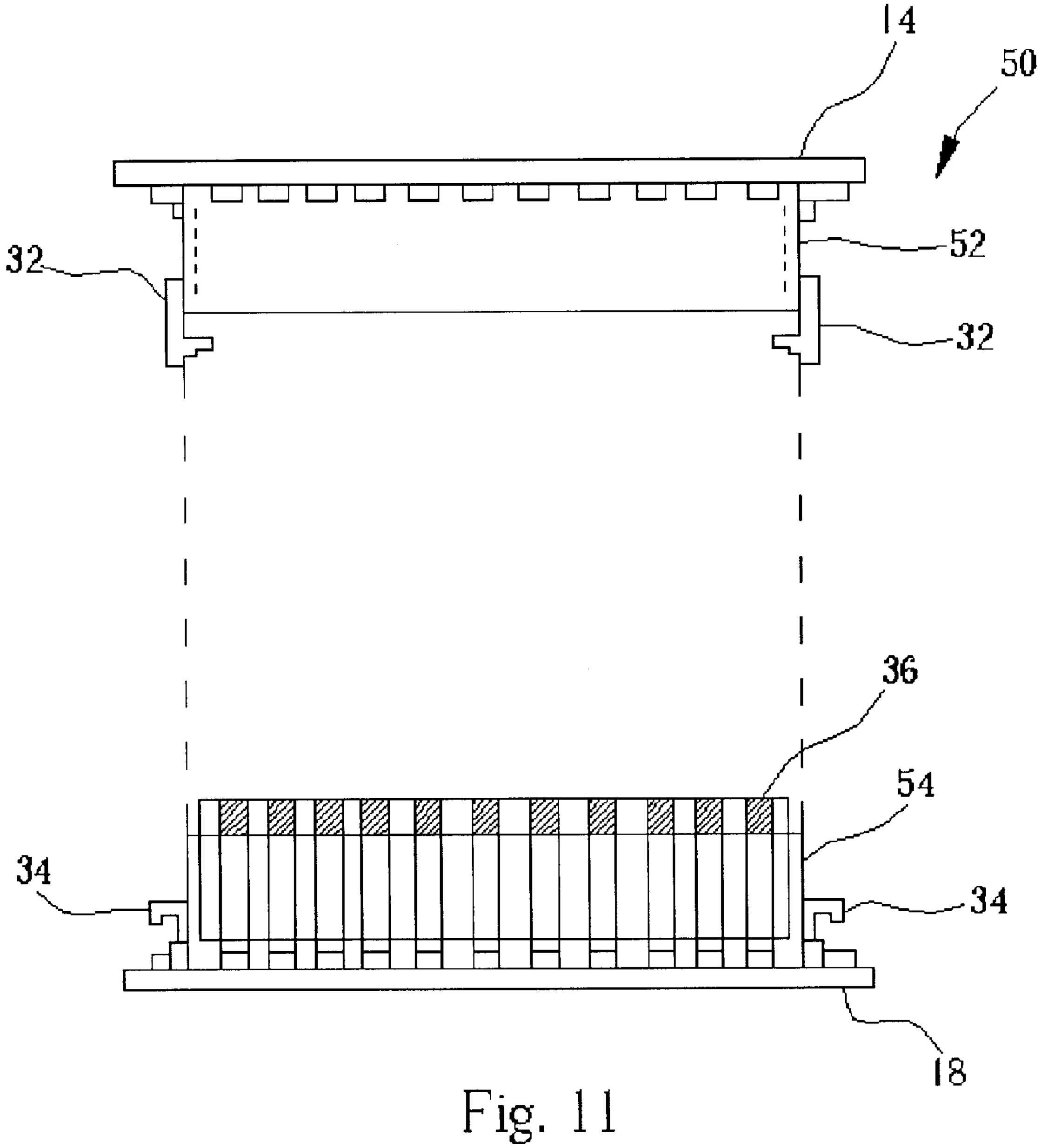
FIG. 11 is a side-view diagram of a third connector while separated according to the third embodiment of the present invention.

Please refer to FIG. 11. FIG. 11 is a side-view diagram of a third connector 50 while separated according to the third embodiment of the present invention. The third connector 50 includes a second upper frame 52 installed on an interface card 14 and a second lower frame 54 installed on a circuit board 18. The circuit board 18 can be a PCB. The second upper frame 52 includes two upper hooks 32, and the second lower frame 54 includes two lower hooks 34 so that the second upper frame 52 and the second lower frame 54 are detachable by hooking the upper hooks 32 and the lower hooks 34 together. The difference when compared to the previously mentioned embodiments is that the third connector 50 has only one row of conductive media 36.

Figure 12:
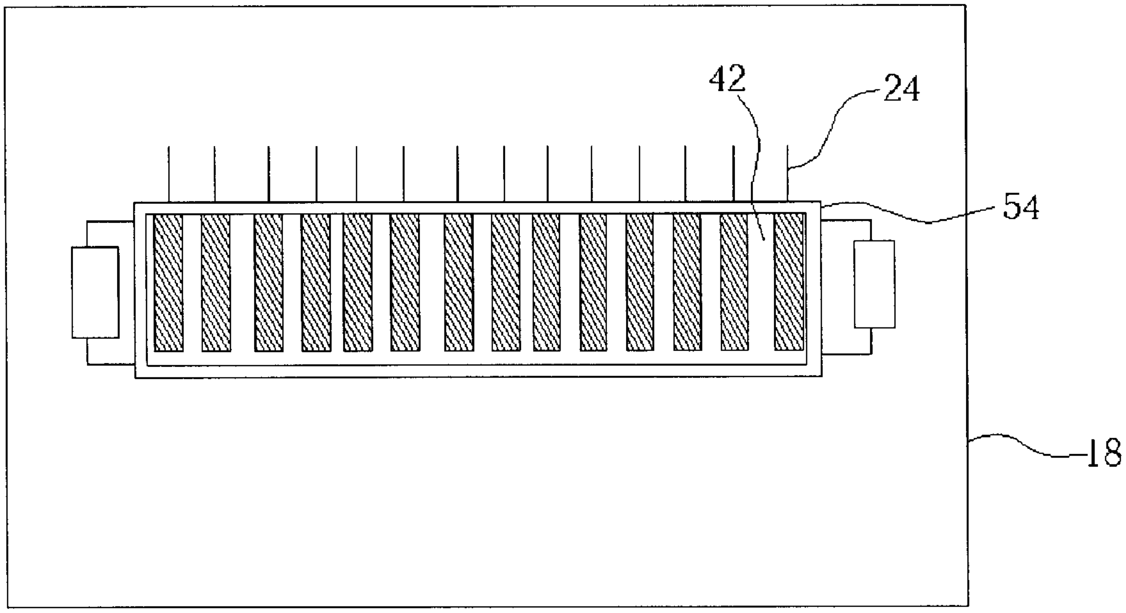
FIG. 12 is a top-view diagram of the second lower frame shown in FIG. 11 connected to the circuit board.
Figure 13:
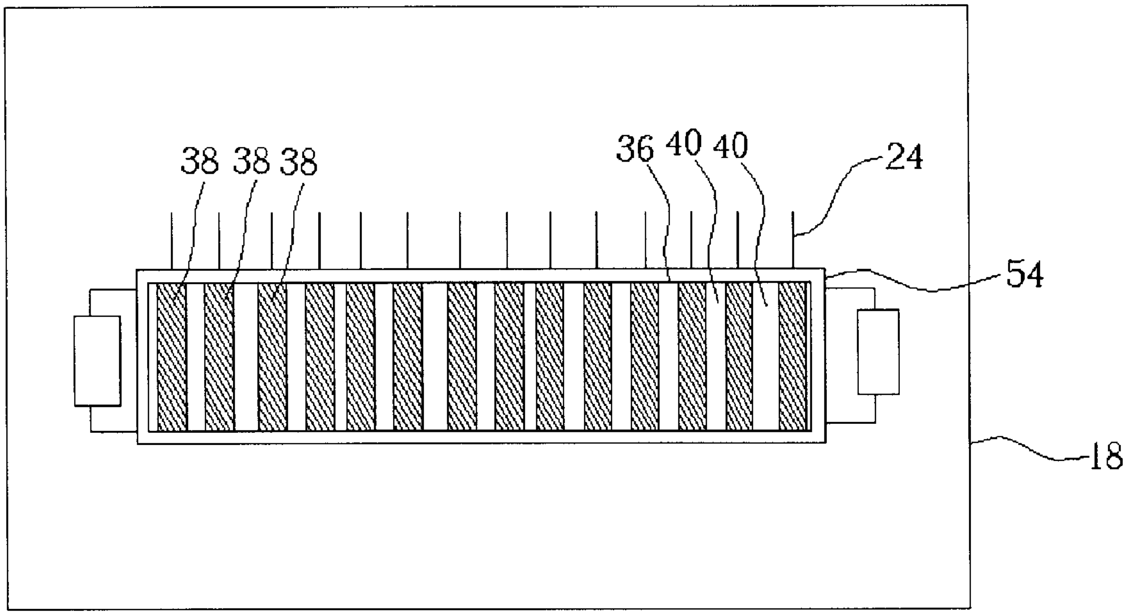
FIG. 13 is a top-view diagram of the conductive medium shown in FIG. 11 held in place by the hollow spaces.

Please refer to FIG. 12. FIG. 12 is a top-view diagram of the second lower frame 54 connected to the circuit board 18. The difference with the previously mentioned embodiments is that, the second lower frame 54 only has one hollow space 42 for holding the conductive media 36. The lower sides of the conductive layers 38 on the conductive media 36 are electrically connected directly to the goldfingers 24 on the circuit board 18. Please refer to FIG. 13. FIG. 13 is a top-view diagram of the conductive media 36 held in place by the hollow space 42. Each one of the conductive layers 38 is connected to each metal line of the goldfingers 24 in order to transmit electrical signals between the conductive layers 38 and the circuit board 18. The structure of the second upper frame 52 is the same to that of the second lower frame 54, which includes one hollow space 42. The connection of the second upper frame 52 and the interface card 14 is the same as shown in FIG. 12. The upper sides of the conductive layers 38 on the conductive media 36 are electrically connected directly to the goldfingers 24 on the interface card 14 and each one of the conductive layers 38 is connected to a metal line of the goldfingers 24 in order to transmit electrical signals between the conductive layers 38 and the interface card 14. A descriptive diagram is hereby omitted.

Figure 14:
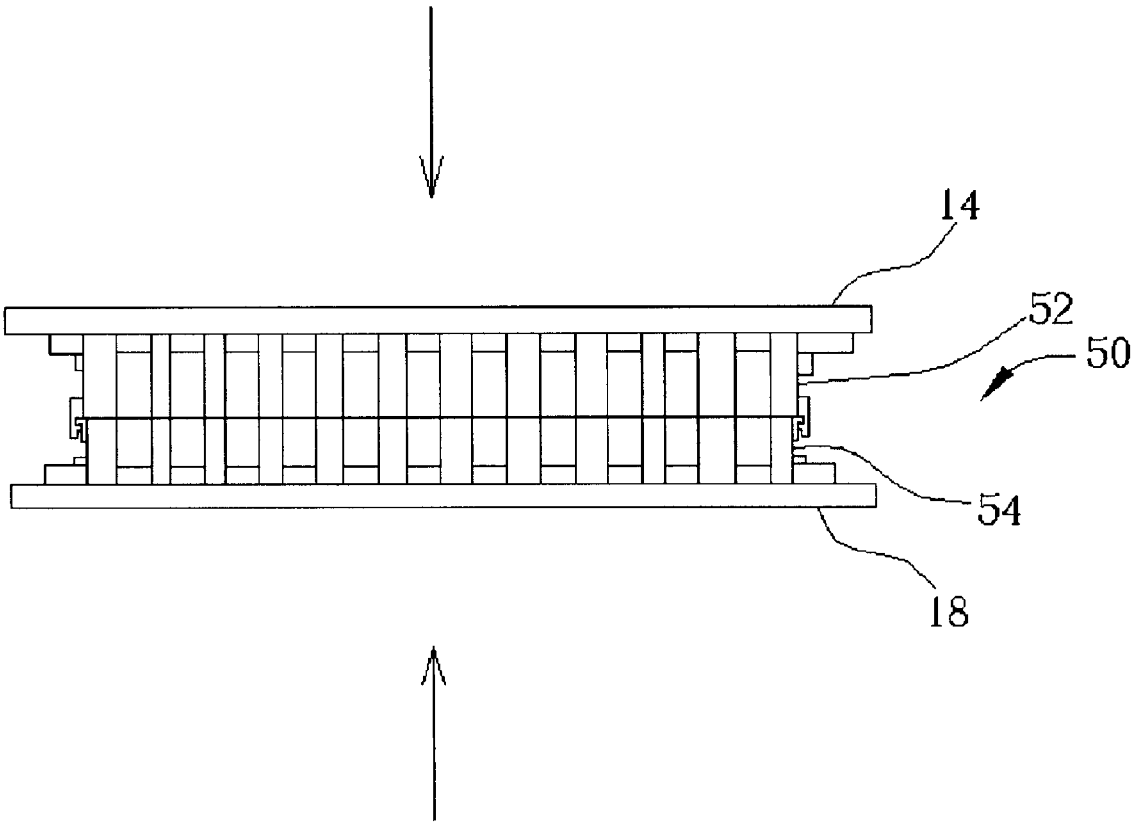
FIG. 14 is a side-view diagram of the third connector shown in FIG. 11 while connected.

The conductive media 36 is fixed to the hollows space of the second upper frame 52 and the second lower frame 54. Please refer to FIG. 14. FIG. 14 is a side-view diagram of the first connector 26 while connected. The connection and the transmission of electrical signals are the same as that in the first embodiment and further descriptions are therefore omitted.

In contrast to the prior art, highly flexible materials such as rubber can be used as insulating materials in conductive media to form the connector according to the present invention. In this way the interval distance between circuit boards can be reduced so that the connector can be more widely applied in electronic products with limited available space. Secondly, the thickness of the conductive layers and the insulating layers is much less than the interval distance between metal lines according to the prior art. In the present invention this distance can be reduced to approximately 0.05 mm so that the space required by the connector is reduced. Thirdly, the cost of the connector according to the present invention is reduced to less than 50 percent of the cost of the prior art, therefore it is very suitable for mass production.

Those skilled in the art will readily observe that numerous modifications and alterations of the device may be made while retaining the teachings of the invention. Accordingly, the above disclosure should be construed as limited only by the meters and bounds of the appended claims.

What is claimed is:

1. A connector for connecting a first board to a second board, the connector comprising:

at least one conductive media comprising:

a plurality of insulating layers; and a plurality of conductive layers, wherein each conductive layer is formed between two insulating layers;

a lower frame substantially surrounding a first hollow space for holding a lower portion of the conductive media, the lower frame comprising a lower hook; and an upper frame substantially surrounding a second hollow space for holding an upper portion of the conductive media, the upper frame comprising an upper hook;

wherein when the conductive media is fixed into the first and second hollow spaces, the upper frame and the lower frame are connected to each other by pressing both frames to hook the upper hook and the lower hook.

2. The connector of claim 1 wherein the conductive media is rectangular cubic shaped.

3. The connector of claim 1 wherein the upper frame is fixed to the second board and the lower frame is fixed to the first board.

4. The connector of claim 3 wherein the upper frame and the lower frame when connected are fixed between the first board and the second board.

5. The connector of claim 1 wherein the first board is fixed to the lower frame through a top plug connection.

6. The connector of claim 3 wherein an upper side of the conductive layer is connected to a goldfinger on the second board through a metal connecting point on the upper frame, and a lower side of the conductive layer is connected to a goldfinger on the first board through a metal connecting point on the lower frame, in order to transmit electric signals between the first board and the second board.

7. The connector of claim 1 wherein the upper and lower frames are plastic.

8. The connector of claim 1 wherein an upper side of the conductive layer is connected to a goldfinger on the second board, and a lower side of the conductive layer is connected to a goldfinger on the first board, in order to transmit electric signals between the first board and the second board.

9. The connector of claim 1 wherein the second board is a printed circuit board.

10. The connector of claim 1 wherein the first board is an interface card.

11. The connector of claim 1 wherein the conductive layers are formed by conductive ceramic particles.

12. The connector of claim 1 wherein the conductive layers are formed by conductive metal particles.

13. The connector of claim 1 wherein the conductive layers are conductive metal lines.

14. The connector of claim 1 wherein the insulating layers are formed by insulating rubber.

15. The connector of claim 1 wherein the insulating layers are formed by insulating ceramic materials.

16. The connector of claim 1 wherein at least a portion of the first hollow space extends through the lower frame such that a lower side of the lower portion of the conductive media is exposed for direct electrical connection between the conductive layers and metal connections on the first board.

17. A connector for electrically connecting a first circuit board to a second circuit board, the connector comprising:

at least one conductive media comprising:

a plurality of insulating layers; and a plurality of conductive layers, wherein each conductive layer is formed between two insulating layers;

a plastic lower frame fixed to the first circuit board and defining a first hollow space extending through the lower frame for holding a lower portion of the conductive media in electrical contact with metal on the first circuit board, the lower frame comprising a lower hook; and plastic upper frame fixed to the second circuit board and defining a second hollow space extending through the upper frame for holding an upper portion of the conductive media in electrical contact with metal on the second circuit board, the upper frame comprising an upper hook hooked to the lower hook for physically connecting the upper and lower frames;

wherein the connected upper and lower frames are disposed between the first and second circuit boards.

18. The connector of claim 17 wherein the first circuit board is fixed to the lower frame through a top plug connection.

* * * * *